US012796111B2

(12) United States Patent
Krishnamurthy

(10) Patent No.: US 12,796,111 B2
(45) Date of Patent: Nov. 10, 2026

(54) HIGH EFFICIENCY CdTe SOLAR CELL WITH TREATED GRAPHENE

(71) Applicant: Srinivasan Krishnamurthy, Cupertino, CA (US)

(72) Inventor: Srinivasan Krishnamurthy, Cupertino, CA (US)

(73) Assignee: Sivananthan Laboratories, Inc., Bolingbrook, IL (US)

( * ) Notice: Subject to any disclaimer, the term of this patent is extended or adjusted under 35 U.S.C. 154(b) by 0 days.

(21) Appl. No.: 17/366,494

(22) Filed: Jul. 2, 2021

(65) Prior Publication Data

US 2022/0037546 A1 Feb. 3, 2022

Related U.S. Application Data

(60) Provisional application No. 63/047,702, filed on Jul. 2, 2020.

(51) Int. Cl.
*H10F 10/162* (2025.01)
*H10F 77/20* (2025.01)

(52) U.S. Cl.
CPC ......... *H10F 10/162* (2025.01); *H10F 77/244* (2025.01)

(58) Field of Classification Search
CPC ........... H01L 31/0296; H01L 31/03925; H01L 31/073; H01L 31/022466; H10F 77/211; H10F 77/244; H10F 77/311
See application file for complete search history.

(56) References Cited

U.S. PATENT DOCUMENTS

| | | | | |
|---|---|---|---|---|
| 2008/0072956 | A1* | 3/2008 | Sharma | H01L 31/02168 136/256 |
| 2008/0308147 | A1* | 12/2008 | Lu | B32B 17/10036 427/457 |
| 2011/0220191 | A1* | 9/2011 | Flood | H01L 51/4266 977/948 |
| 2012/0143544 | A1* | 6/2012 | Murata | H01L 51/0072 257/431 |
| 2020/0343403 | A1* | 10/2020 | Heben | H01L 31/02167 |

* cited by examiner

*Primary Examiner* — Golam Mowla
(74) *Attorney, Agent, or Firm* — Erickson Law Group, PC.

(57) ABSTRACT

A solar cell includes a doped CdTe layer; a graphene layer over the CdTe layer; and metal contacts over the graphene layer. Advantageously, the metal contacts are composed of Pt or $MoO_{3-x}$. The doped CdTe layer can be composed of a p-doped CdTe layer, and the solar cell comprises an n-doped CdS layer beneath the CdTe layer. The solar cell can include a conducting oxide layer beneath the CdS layer. The conducting oxide layer can be composed of $SnO_2$:F. The solar cell can include a glass layer beneath the conducting oxide layer. The graphene contacting the MoO contacts particularly alleviates the issue of the inability of prior CdTe solar cells to collect holes and could increase efficiency by about 5%.

12 Claims, 1 Drawing Sheet

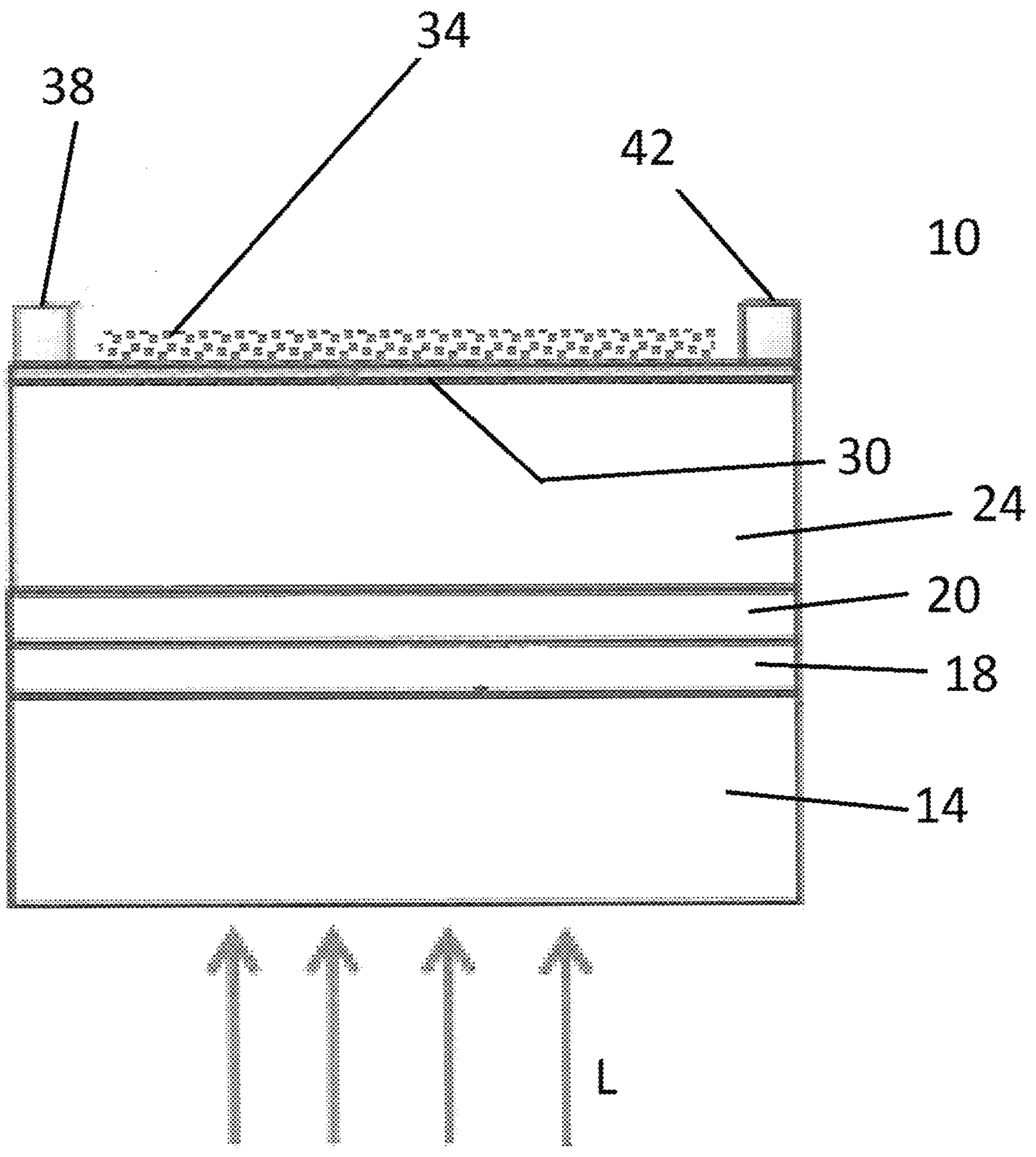
38
34
42
10
30
24
20
18
14
L

HIGH EFFICIENCY CdTe SOLAR CELL WITH TREATED GRAPHENE

This application claims the benefit of U.S. Provisional Application Ser. No. 63/047,702, filed Jul. 2, 2020.

BACKGROUND

The current best CdTe solar cells have a demonstrated efficiency of 19.6%, which is considerably below the maximum achievable value of 33.7%. Of the three factors—open-circuit voltage (VOC), short-circuit current density (JSC) and fill-factor (FF)—that determine the efficiency, only JSC has reached close to the theoretical limit. The inability to achieve high p-type doping and ohmic back-contacts are hypothesized to negatively impact VOC and FF. The use of copper (Cu) as a back contact increases the local p-doping by forming $Cu_2Te$ and thus provides a tunnel barrier for hole extraction. Still the contact is non-ohmic, because of the large difference between the work function of Cu (4.5 eV) and p-CdTe (≈5.7 eV). Additionally, Cu diffused to the p-n junction reduces VOC. Efforts for Cu-free back contacts such as molybdenum oxide ($MoO_{3-x}$) with a work function of 6.9 eV either introduced series resistance or decreased FF due to formation of compounds at the CdTe/$MoO_{3-x}$ interface.

The present inventor has recognized that is would be desirable to increase the efficiency of solar cells by providing an improved contact arrangement.

The present inventor has recognized that the inability of prior CdTe solar cells to collect holes results in low efficiency.

SUMMARY

The present inventor has recognized that an inert material with a large work function and low resistivity is advantageous to achieve ohmic contact (a non-rectifying electrical junction: a junction between two conductors that has a linear current-voltage (I-V) curve as with Ohm's law), and thus improve efficiency.

An exemplary embodiment solar cell includes a doped CdTe layer; a graphene layer over the CdTe layer; and metal contacts over the graphene layer. Advantageously, the metal contacts are composed of Pt or $MoO_{3-x}$.

The doped CdTe layer can be composed of a p-doped CdTe layer, and the solar cell comprises an n-doped CdS layer beneath the CdTe layer.

The solar cell can include a conducting oxide layer beneath the CdS layer. The conducting oxide layer can be composed of $SnO_2$:F.

The solar cell can include a glass layer beneath the conducting oxide layer.

The graphene contacting the MoO contacts particularly alleviates the issue of the inability of prior CdTe solar cells to collect holes and could increase efficiency by about 5%.

The work function of intrinsic graphene is ≈4.5 eV and is known to vary as much as ±1.2 eV with electrical or contact doping. With an appropriate contact metal, such as Pt (with work function of 5.9 eV) or $MoO_{3-x}$ (with work function of 6.9 eV) the graphene work function can be matched or lowered to that of p-doped CdTe. Graphene is inert and attaches to the surface only by van der Waals interaction, thus avoiding complicated compound formation. Graphene has high mobility and with the heavy doping by the contact metal, its sheet resistance can be reduced to 30-50Ω (ohms). The $MoO_3$ work function is much deeper than that of graphene and hence the electrons from graphene transfer to $MoO_3$. Hence the graphene is now deficient of electrons and this is essentially hole doping of graphene. Low sheet resistance and matched work functions remove the barrier at the interface and thus improve efficiency.

Numerous other advantages and features of the present invention will be become readily apparent from the following detailed description of the invention and the embodiments thereof, and from the accompanying drawings.

BRIEF DESCRIPTION OF THE DRAWINGS

FIG. 1 is a schematic cross-sectional view of an exemplary embodiment solar cell of the invention.

DETAILED DESCRIPTION

While this invention is susceptible of embodiment in many different forms, there are shown in the drawings, and will be described herein in detail, specific embodiments thereof with the understanding that the present disclosure is to be considered as an exemplification of the principles of the invention and is not intended to limit the invention to the specific embodiments illustrated.

This application claims the benefit of U.S. Provisional Application Ser. No. 63/047,702, filed Jul. 2, 2020, which is herein incorporated by reference in its entirety.

FIG. 1 illustrates a solar cell 10, formed of a glass layer 14, a conducting oxide layer layer 18 such as a fluorine-doped, tin oxide ($SnO_2$:F) layer, a doped Group II-VI material such as an n-doped cadmium sulfide (n-CdS) layer 20, a doped Group II-VI material such as a p-doped cadmium telluride (p-CdTe) layer 24, a graphene layer 30, a platinum (Pt) or molybdenum oxide ($MoO_{3-x}$) layer 34 and contacts 38, 42. The Pt and $MoO_3$ have very low work function and they dope graphene deeply and hence graphene Fermi level matches that of CdTe, enabling easy extraction of holes from the solar cell. The contacts can be composed of Pt or $MoO_{3-x}$ material. Light "L" impinges on the glass side of the solar cell 10.

Solar cells using a CdTe layer, and methods of fabricating such solar cells are disclosed in U.S. Pat. Nos. 10,340,405; 9,837,563; and 8,912,428, all herein incorporated by reference to the extent that the references are not contradictory to the present disclosure.

The work function of intrinsic graphene is ≈4.5 eV and is known to vary as much as ±1.2 eV with electrical or contact doping. With an appropriate contact metal, such as Pt (with work function of 5.9 eV) or $MoO_{3-x}$ (with work function of 6.9 eV) the graphene work function can be matched or lowered to that of p-doped CdTe. Graphene is inert and attaches to the surface only by van der Waals interaction, thus avoiding complicated compound formation. Graphene has high mobility and with the heavy doping by the contact metal, its sheet resistance can be reduced to 30-50Ω (ohms). Low sheet resistance and matched work functions remove the barrier at the interface and thus improve efficiency. The basic design is shown in FIG. 1 and the predicted performance under various improvements are shown in Table 1. By comparing row 1 and row 3, we note that reducing the work function to zero or negative, as promised by the MoOx-doped graphene, the solar cell efficiency can increase by over 5.5%.

The work function p-CdTe is −5.9 eV. $MoO_{3-x}$-covered graphene has a work function of −6 eV or more. The lower or matched work function enables efficient collection of holes and thus results in higher efficiency.

TABLE 1

| n-CdTe: $n_D$ | n-CdTe: $n_T$ | p-CdTe: $n_A$ | n-CdTe: $n_T$ | $(\phi_M - \phi_{CdTe})$ | Efficiency |
|---|---|---|---|---|---|
| $1 \times 10^{18}$ | $2 \times 10^{14}$ | $1 \times 10^{15}$ | $2 \times 10^{14}$ | 0.6 | 16.61 |
| $1 \times 10^{18}$ | $2 \times 10^{12}$ | $1 \times 10^{15}$ | $2 \times 10^{12}$ | 0.6 | 17.74 |
| $1 \times 10^{18}$ | $2 \times 10^{14}$ | $1 \times 10^{15}$ | $2 \times 10^{14}$ | 0.0 or −ve | 22.20 |
| $1 \times 10^{18}$ | $2 \times 10^{12}$ | $1 \times 10^{15}$ | $2 \times 10^{12}$ | 0.0 or −ve | 29.80 |
| $1 \times 10^{18}$ | $2 \times 10^{12}$ | $1 \times 10^{14}$ | $2 \times 10^{12}$ | 0.0 or −ve | 30.14 |

Table 1 indicates the calculated efficiency under various defect density and work function conditions. Note that matched work function (column 5) increases the efficiency by over 5.5% (compare $6^{th}$ column of rows 1 and 3)

From the foregoing, it will be observed that numerous variations and modifications may be incorporated without departing from the spirit and scope of the invention. It is to be understood that no limitation with respect to the specific apparatus illustrated herein is intended or should be inferred.

The invention claimed is:

1. A solar cell, comprising:
an n-doped CdS layer;
a p-doped CdTe layer substantially covering the n-doped CdS layer;
a graphene layer substantially covering the CdTe layer on a side opposite the n-doped CdS layer;
a platinum or molybdenum oxide layer substantially covering the graphene layer on a side opposite the p-doped CdTe layer, wherein the platinum or molybdenum covered graphene layer has an eV work function lower than an eV work function of the p-doped CdTe layer; and
metal contacts on the graphene layer on the side opposite the p-doped CdTe layer;
comprising a conducting oxide layer substantially covering the CdS layer on a side opposite the p-doped CdTe layer; and
comprising a glass layer substantially covering the conducting oxide layer on a side opposite the n-doped CdS layer.

2. The solar cell according to claim 1, wherein the metal contacts are composed of platinum.

3. A solar cell, comprising:
an n-doped layer;
a p-doped Group II-VI layer substantially covering the n-doped layer;
a graphene layer substantially covering the p-doped Group II-VI layer on a side opposite the n-doped layer;
a platinum or molybdenum oxide layer substantially covering the graphene layer on a side opposite the p-doped Group II-IV layer, wherein the platinum or molybdenum covered graphene layer has an eV work function lower than an eV work function of the p-doped Group II-IV layer; and
metal contacts on the graphene layer on the side opposite the p-doped Group II-IV layer;
wherein the metal contacts are composed of molybdenum oxide.

4. The solar cell according to claim 3, wherein the p-doped Group II-VI layer comprises a p-doped CdTe layer, and the n-doped layer comprises an n-doped CdS layer.

5. The solar cell according to claim 4, comprising a conducting oxide layer covering the n-doped CdS layer on a side opposite the p-doped CdTe layer.

6. A solar cell, comprising:
an n-doped layer;
a p-doped Group II-VI layer substantially covering the n-doped layer:
a graphene layer substantially covering the p-doped Group II-VI layer on a side opposite the n-doped layer;
a platinum or molybdenum oxide layer substantially covering the graphene layer on a side opposite the p-doped Group II-IV layer, wherein the platinum or molybdenum covered graphene layer has an eV work function lower than an eV work function of the p-doped Group II-IV layer; and
metal contacts on the graphene layer on the side opposite the p-doped Group II-IV layer, wherein the p-doped Group II-VI layer comprises a p-doped CdTe layer, and the n-doped layer comprises an n-doped CdS layer;
wherein the conducting oxide layer is composed of fluorine-doped, tin oxide ($SnO_2$:F).

7. The solar cell according to claim 6, wherein the metal contacts are composed of platinum.

8. The solar cell according to claim 6, comprising a glass layer substantially covering the conducting oxide layer on a side opposite the n-doped CdS layer.

9. The solar cell according to claim 8 wherein the platinum or molybdenum oxide layer is a platinum layer.

10. A solar cell, comprising:
an n-doped CdS layer;
a p-doped CdTe layer substantially covering the n-doped CdS layer;
a graphene layer substantially covering the CdTe layer on a side opposite the n-doped CdS layer;
a platinum or molybdenum oxide layer substantially covering the graphene layer on a side opposite the p-doped CdTe layer, wherein the platinum or molybdenum covered graphene layer has an eV work function lower than an eV work function of the p-doped CdTe layer; and
metal contacts on the graphene layer on the side opposite the p-doped CdTe layer;
wherein the platinum or molybdeum oxide layer is a molybdeum oxide layer.

11. The solar cell according to claim 3 wherein the platinum or molybdenum oxide layer is a platinum layer.

12. A solar cell, comprising:
an n-doped layer;
a p-doped Group II-VI layer substantially covering the n-doped layer;
a graphene layer substantially covering the p-doped Group II-VI layer on a side opposite the n-doped layer;
a platinum or molybdenum oxide layer substantially covering the graphene layer on a side opposite the p-doped Group II-IV layer, wherein the platinum or molybdenum covered graphene layer has an eV work function lower than an eV work function of the p-doped Group II-IV layer; and
metal contacts on the graphene layer on the side opposite the p-doped Group II-IV layer;

wherein the platinum or molybdenum oxide layer is a molybdenum oxide layer.

* * * * *